US008413084B2

(12) United States Patent
Rankin

(10) Patent No.: US 8,413,084 B2
(45) Date of Patent: Apr. 2, 2013

(54) PHOTOMASK THROUGHPUT BY REDUCING EXPOSURE SHOT COUNT FOR NON-CRITICAL ELEMENTS

(75) Inventor: Jed H. Rankin, Richmond, VT (US)

(73) Assignee: International Business Machines Corporation, Armonk, NY (US)

( * ) Notice: Subject to any disclaimer, the term of this patent is extended or adjusted under 35 U.S.C. 154(b) by 226 days.

(21) Appl. No.: 12/896,947

(22) Filed: Oct. 4, 2010

(65) Prior Publication Data

US 2012/0082923 A1 Apr. 5, 2012

(51) Int. Cl.
*G06F 17/50* (2006.01)
*G03F 1/00* (2012.01)

(52) U.S. Cl. .................... 716/53; 716/50; 716/55; 430/5

(58) Field of Classification Search .................... 716/50, 716/53, 55; 430/5
See application file for complete search history.

(56) References Cited

U.S. PATENT DOCUMENTS

| | | | | |
|---|---|---|---|---|
| 7,009,753 | B2 | 3/2006 | Sandstrom | |
| 2005/0125164 | A1* | 6/2005 | Haffner et al. | 702/35 |
| 2007/0009808 | A1 | 1/2007 | Abrams et al. | |
| 2007/0031740 | A1* | 2/2007 | Chen et al. | 430/5 |

FOREIGN PATENT DOCUMENTS

| | | |
|---|---|---|
| JP | 2003332216 | 11/2003 |
| WO | 2007030525 A2 | 3/2007 |

* cited by examiner

*Primary Examiner* — Vuthe Siek
*Assistant Examiner* — Magid Dimyan
(74) *Attorney, Agent, or Firm* — Richard M. Kotulak; Hoffman Warnick LLC

(57) ABSTRACT

A solution for improving photomask fabrication time and yield, through the reduction in the number of exposure shots used for a given photomask pattern to be written on the photomask. In one embodiment, non-critical elements can be configured into a shape that the write tool can write with less exposure shots, while maintaining the original intent of the non-critical element. In another embodiment, the pattern of non-critical elements can be configured such that the non-critical elements are aligned with the grid lines of the operational grid of the write tool to further reduce shot count. In another embodiment, the manufacturing parameters and placement of non-critical elements can be modifying, e.g., by identifying which elements are critical and which are non-critical, and then printing non-critical elements with a first exposure parameter (e.g. a single pass exposure) while critical elements are printed with a second exposure parameter (e.g., a multi pass exposure).

16 Claims, 5 Drawing Sheets

60
50
50a
50b
62
R1
R2
R3

100
200
62
62
R1
R2
R3

PHOTOMASK THROUGHPUT BY REDUCING EXPOSURE SHOT COUNT FOR NON-CRITICAL ELEMENTS

TECHNICAL FIELD

Embodiments of this invention relate generally to integrated circuits and, more particularly, to methods for improving photomask throughput and yield by modifying manufacturing parameters, placement, shapes and patterns of non-critical elements to reduce exposure shot count for the non-critical elements.

BACKGROUND

Photomasks are becoming an increasingly expensive fraction of the overall semiconductor manufacture cost. Traditionally, photomasks have accounted for less than one percent of the cost of semiconductor chip manufacturing. However, as photomask technology requirements become more advanced and volume per part number decreases, the relative cost of photomask fabrication is increasing significantly.

One of the most costly photomask production steps is forming the image in a photoresist by using energized radiation, such as e-beam or laser direct write systems. The increasingly stringent requirements on photomask performance have necessitated the use of more advanced technologies, including vector shaped beam e-beam lithography. In the vector shaped beam lithography technology, the photomask lithography step can take eight to ten hours and as much as twenty four or thirty six hours, depending on the pattern complexity.

The throughput of photomask patterning is directly related to the number of exposure "shots" (discrete exposure regions) used to construct the desired image. Current design, optical proximity correction (OPC), and use of fill shapes are all done with little regard for the parameter of number of shots required for shape reconstruction. Similarly modern chip design's increased usage of "dummy" features, such as fill shapes, holes, and gate array like patterns, leads to increased photomask complexity and costs from increased print-time. The function of these patterns is to increase pattern density and geometric homogeneity which help achieve tolerance requirements during photomask and wafer fabrication.

SUMMARY OF THE INVENTION

Embodiments of this invention provide solutions for improving photomask fabrication time and yield, through the reduction in the number of exposure shots used for a given photomask pattern to be written on the photomask from a set of design data. The optimization will best be applied to non-critical elements. Such elements include fill shapes, fiducials, barcodes, custom statistical process controls (SPC), test and monitoring circuits, clear bars, probe pads and other custom features. In one embodiment, non-critical elements can be configured into a shape (layout and size) that the write tool can write with less exposure shots, while maintaining the original intent of the non-critical element. In another embodiment, the pattern of non-critical elements can be configured such that the non-critical elements are aligned with the grid lines of the operational grid of the write tool to further reduce shot count. In another embodiment, the manufacturing parameters and placement of non-critical shots can be modified, e.g., by identifying which elements are critical and which are non-critical, and then printing non-critical elements with one set of exposure parameters, which are optimized for speed, rather than performance, while critical elements are printed with a different set of exposure parameters, which are optimized for performance.

A first aspect of the invention provides a method comprising: identifying which elements are non-critical in a predetermined set of design data used for printing a given photomask pattern, the design data including both non-critical elements and critical elements, at least one non-critical element having a shape requiring a predetermined number of multiple write tool shots; and reconfiguring the at least one non-critical element into a reconfigured shape that the write tool can write with a number of shots less than the predetermined number, wherein the reconfigured shape has an area substantially equal to an area of the respective at least one non-critical element, to reduce the number of exposure shots required for the given photomask pattern.

A second aspect of the invention provides a method comprising: identifying which elements are non-critical in a predetermined set of design data used for printing a given photomask pattern by a write tool, the design data including both non-critical elements and critical elements, the design data further including a pattern for writing the non-critical elements, wherein the pattern results in at least one non-critical element overlapping at least one grid line of an operational grid of the write tool; reconfiguring the pattern into a reconfigured pattern such that the non-critical elements are aligned with the grid lines of the operational grid of the write tool to reduce the number of exposure shots required for the given photomask pattern.

A third aspect of the invention provides a method comprising: providing a predetermined set of design data including a set of elements to be used for printing a given photomask pattern, the design data including both non-critical elements and critical elements; identifying which elements in the set of elements are critical elements and which elements in the set of elements are non-critical elements; printing the critical elements using a first exposure parameter on the photomask; and printing the non-critical elements using a second exposure parameter on the photomask.

A fourth aspect of the invention provides a computer program comprising program code embodied in at least one computer-readable storage medium, which when executed, enables a computer system to implement a method of reducing the number of exposure shots required for a photomask pattern, the method comprising: providing a predetermined set of design data including a set of elements to be used for printing a given photomask pattern, the design data including both non-critical elements and critical elements, at least one non-critical element having a shape requiring a predetermined number of multiple write tool shots; identifying which elements in the set of elements are critical elements and which elements in the set of elements are non-critical elements; and reconfiguring the at least one non-critical element into a reconfigured shape that the write tool can write with a number of shots less than the predetermined number, wherein the reconfigured shape has an area substantially equal to an area of the respective at least one non-critical element, to reduce the number of exposure shots required for the given photomask pattern.

BRIEF DESCRIPTION OF DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION OF INVENTION

According to an embodiment of the present invention, methods are provided for improving photomask fabrication time and yields, during photomask production, through reducing the number of exposure shots used for printing a given photomask pattern, e.g., by modifying the shape of a non-critical element, reconfiguring a pattern of non-critical elements on a photomask, or modifying the manufacturing parameters or placement of non-critical elements on a photomask. A set of design data is used by a write tool for printing a given photomask and can be predetermined and stored on a database. The design data will typically include both non-critical elements and critical elements for which photomasks will need to be printed. As one of ordinary skill in the art would understand, non-critical elements refer to those elements included on a wafer layout that exist solely for fabrication and assisting other elements, i.e., the critical elements, in their intended purposes. For example, non-critical elements can be used to reduce the variation in densities between other, critical, elements, to allow for better chemical metal polishing (CMP). As such, non-critical elements do not add electrical functionality to the wafer, i.e., they do not have an electrical purpose in the final devices, but they improve the manufacturability, control, or yield of the chip. Such non-critical elements can include fill shapes, fiducials, barcodes, custom SPC, test and monitoring circuits, clear bars, probe pads and/or other mask or wafer fabrication design elements which are not sensitive to exact size or placement for functionality. The printing of each of these elements on a photomask is time-consuming. Embodiments of this invention focus on reducing the time required to print a photomask for the non-critical elements.

Figure 1:
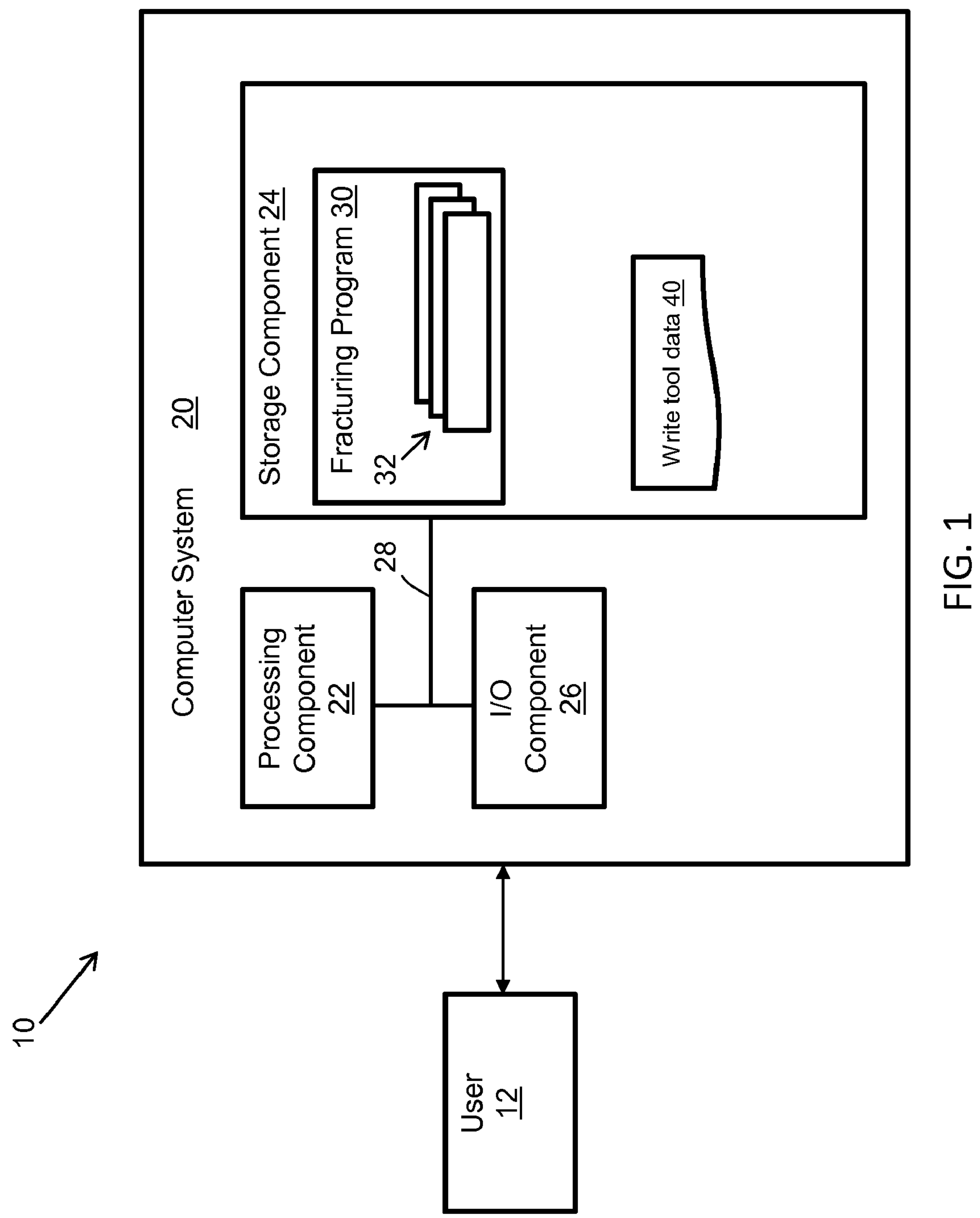
FIG. 1 shows an illustrative environment for performing methods according to embodiments of this invention.

Turning to FIG. 1, an illustrative environment 10 for reducing the number of exposure shots required for a given photomask pattern according to embodiments of this invention is shown. To this extent, environment 10 includes a computer system 20 that can perform a process described herein in order to reconfigure non-critical elements and reconfigure non-critical element patterns. In particular, computer system 20 is shown including a fracturing program 30, which makes computer system 20 operable to configure non-critical elements, reconfigure non-critical element patterns and modify the manufacturing parameters and placement of non-critical elements by performing a process described herein.

Computer system 10 is shown including a processing component 22 (e.g., one or more processors), a storage component 24 (e.g., a storage hierarchy), an input/output (I/O) component 26 (e.g., one or more I/O interfaces and/or devices), and a communications pathway 28. In general, processing component 22 executes program code, such as fracturing program 30, which is at least partially fixed in storage component 24. While executing program code, processing component 22 can process data, which can result in reading and/or writing transformed data from/to storage component 24 and/or I/O component 26 for further processing. Pathway 28 provides a communications link between each of the components in computer system 20. I/O component 26 can comprise one or more human I/O devices, which enable a human user 12 to interact with computer system 20 and/or one or more communications devices to enable a system user 12 to communicate with computer system 20 using any type of communications link. To this extent, fracturing program 30 can manage a set of interfaces (e.g., graphical user interface(s), application program interface, and/or the like) that enable human and/or system users 12 to interact with fracturing program 30. Further, fracturing program 30 can manage (e.g., store, retrieve, create, manipulate, organize, present, etc.) the data, such as write tool data 40, including the design data discussed herein used by the write tool for printing the photomask, using any solution. For example, computer system 20 can generate and/or be used to generate write tool data 40, retrieve write tool data 40 from one or more data stores, receive write tool data 40 from another system, and/or the like.

In any event, computer system 20 can comprise one or more general purpose computing articles of manufacture (e.g., computing devices) capable of executing program code, such as fracturing program 30, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, fracturing program 30 can be embodied as any combination of system software and/or application software.

Further, fracturing program 30 can be implemented using a set of modules 32. In this case, a module 32 can enable computer system 20 to perform a set of tasks used by fracturing program 30, and can be separately developed and/or implemented apart from other portions of fracturing program 30. As used herein, the term "component" means any configuration of hardware, with or without software, which implements the functionality described in conjunction therewith using any solution, while the term "module" means program code that enables a computer system 20 to implement the actions described in conjunction therewith using any solution. When fixed in a storage component 24 of a computer system 20 that includes a processing component 22, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 20.

When computer system 20 comprises multiple computing devices, each computing device can have only a portion of fracturing program 30 fixed thereon (e.g., one or more modules 32). However, it is understood that computer system 20 and fracturing program 30 are only representative of various possible equivalent computer systems that may perform a process described herein. To this extent, in other embodiments, the functionality provided by computer system 20 and fracturing program 30 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 20 includes multiple computing devices, the computing devices can communicate over any type of communications link. Further, while performing a process described herein, computer system 20 can communicate with one or more other computer systems using any type of communications link. In either case, the communications link can comprise any combination of various types of wired and/or wireless links; comprise any combination of one or more types of networks; and/or utilize any combination of various types of transmission techniques and protocols.

As discussed herein, fracturing program 30 enables computer system 20 to reduce the number of exposure shots required for a given photomask pattern through various methods including: reconfiguring the shapes (layout and size) of non-critical elements, reconfiguring the pattern of non-critical elements and/or modifying the manufacturing parameters or placement of non-critical features.

Figure 2:
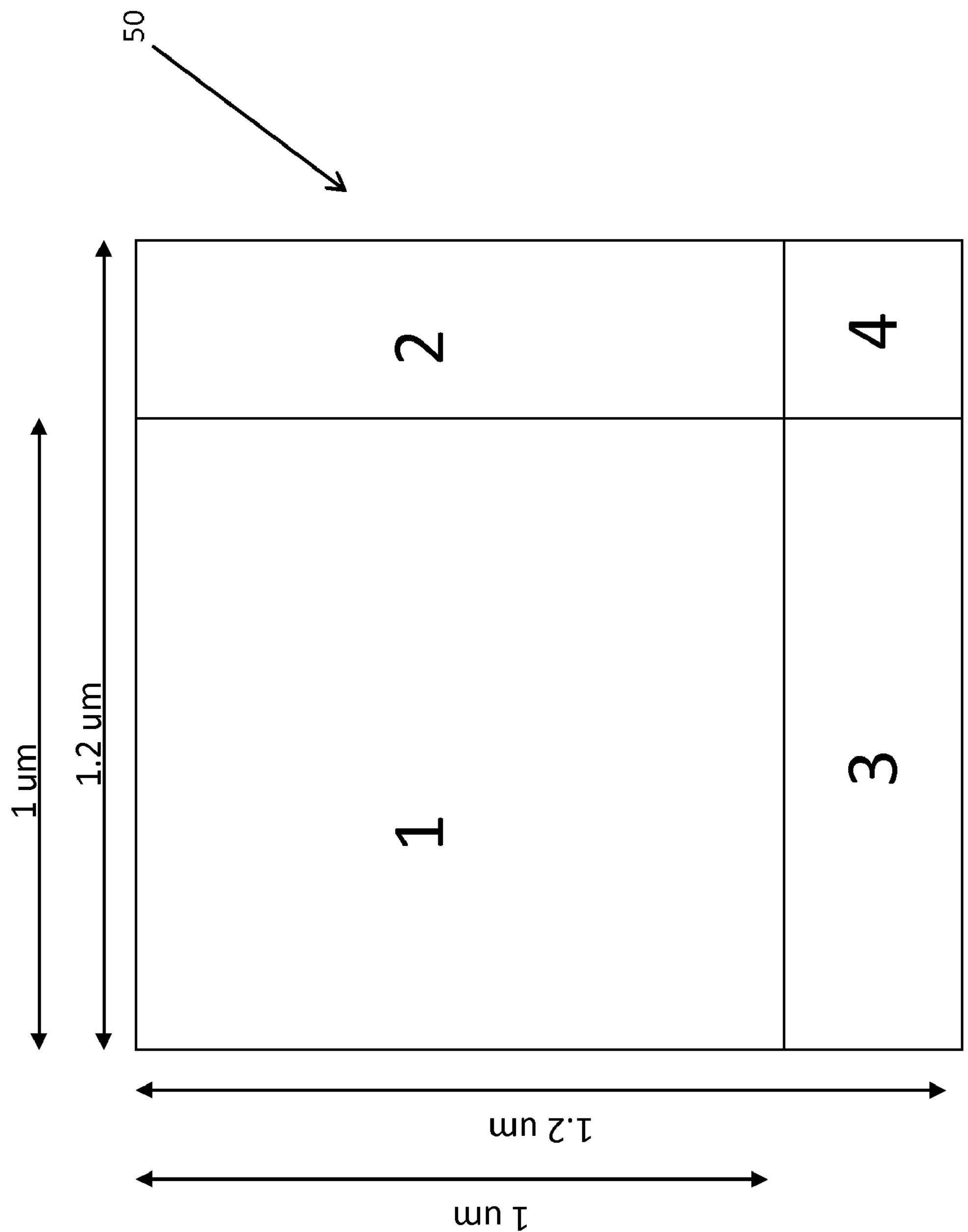
FIGS. 2 and 3 show a given non-critical element before and after optimization using a method of the invention, respectively.

Turning to FIG. 2, an illustrative non-critical element 50 is shown. As FIG. 2 shows, non-critical element 50 has a shape that requires a predetermined number of multiple write tool shots. Using the example shown in FIG. 2, element 50 has a shape with a dimension of 1.2 μm in the X direction and 1.2 μm in the Y direction, for a total area of 1.44 μm. When shot, two exposure shots will be required in each direction, shots 1 and 2 in the X direction and shots 3 and 4 in the Y direction, for a total of four exposure shots.

Figure 3:
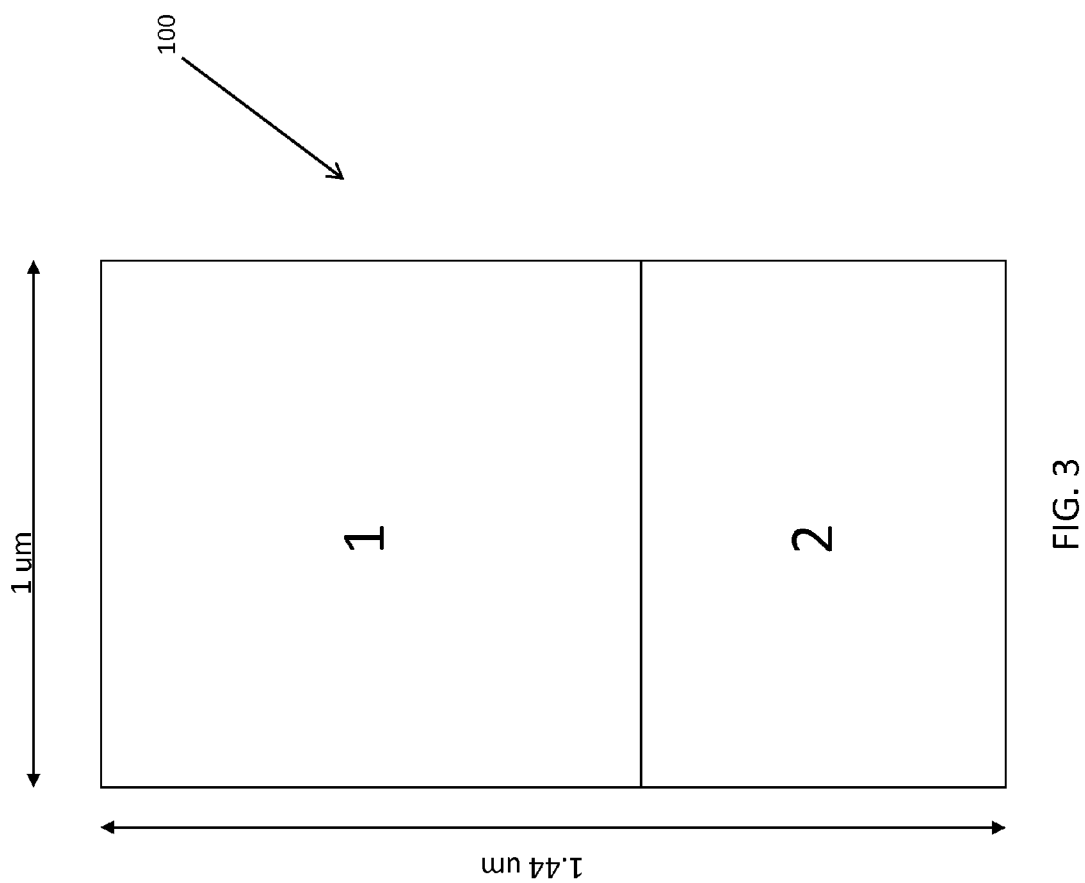

Turning to FIG. 3, a non-critical element 100 according to an embodiment of this invention is shown. As shown in FIG. 3, non-critical element 100 has been configured (or reconfigured) using fracturing program 30 (FIG. 1) such that the write tool can write non-critical element 100 with a number of shots less than the predetermined number of shots required for the original non-critical element 50, while maintaining an intent (e.g., an area in this example) substantially equal to an intent (e.g., area) of the original non-critical element 50. An "intent" of a non-critical element refers to the purpose of the non-critical element in the photomask. For example, a non-critical element may be included to reproduce periodicity, reproduce topographical uniformity, provide metrology or alignment structures, serve another non-position dependent electrical function, etc. Using the example shown in FIGS. 2 and 3, fracturing program 30 has configured non-critical element 100 such that a substantially same area of 1.44 μm of element 50 will be maintained, but the dimensions in the X and Y directions will be reconfigured to 1.0 μm and 1.44 μm respectively. Shot 1 will fill the dimension needed for the X direction. Following shot 1, shot 2 will be adjusted down from its maximum shot size of 1.0 μm to 0.44 μm to fill the remaining dimension in the Y direction. Thus the number of total shots required for element 100 is two, a 50% reduction from the number of shots required for non-critical element 50 having the same area in FIG. 2. This reduction in the number of shots will improve photomask fabrication time and yields, during photomask production.

The reconfiguring of non-critical element 50 can include using fracturing program 30 to segment non-critical element 50 into segments based on write tool limitations and optical proximity correction (OPC) limitations. For example, in the example shown in FIGS. 2 and 3, the reconfiguring was accomplished by taking into account a write tool limitation of less than or equal to approximately 1 μm, resulting in a 50% shot count reduction, while maintaining substantially the same total area, assuming the shot size limit of approximately 1 μm. It is important, however, to consider the OPC or lithographic limitations when optimizing the non-critical elements for write optimization. For example, if corners of adjacent elements are moved too close to each other, or elements become too narrow, it may not be possible for the OPC and lithography combination to accurately resolve the modified shapes. This could result in the printed solution having significantly different character and effect than originally intended.

Embodiments of this invention are particularly appropriate for non-critical elements, such as a fill shape, because it is typically more important to maintain an intent, e.g., a total area, than specific dimensions, of the element, so the reconfiguring is acceptable from a design standpoint. Therefore, according to an embodiment of this invention, a shape (layout and size), e.g., dimensions in an X direction and a Y direction, of non-critical elements 100 can be reconfigured, while maintaining substantially the same intent (e.g., substantially the same overall area), to reduce the shot count required to print the photomask. Once non-critical element 100 has been reconfigured, the write tool can print the photomask. The write tool can be an e-beam writing tool, but may be any tool that performs a direct write operation.

Figure 4:
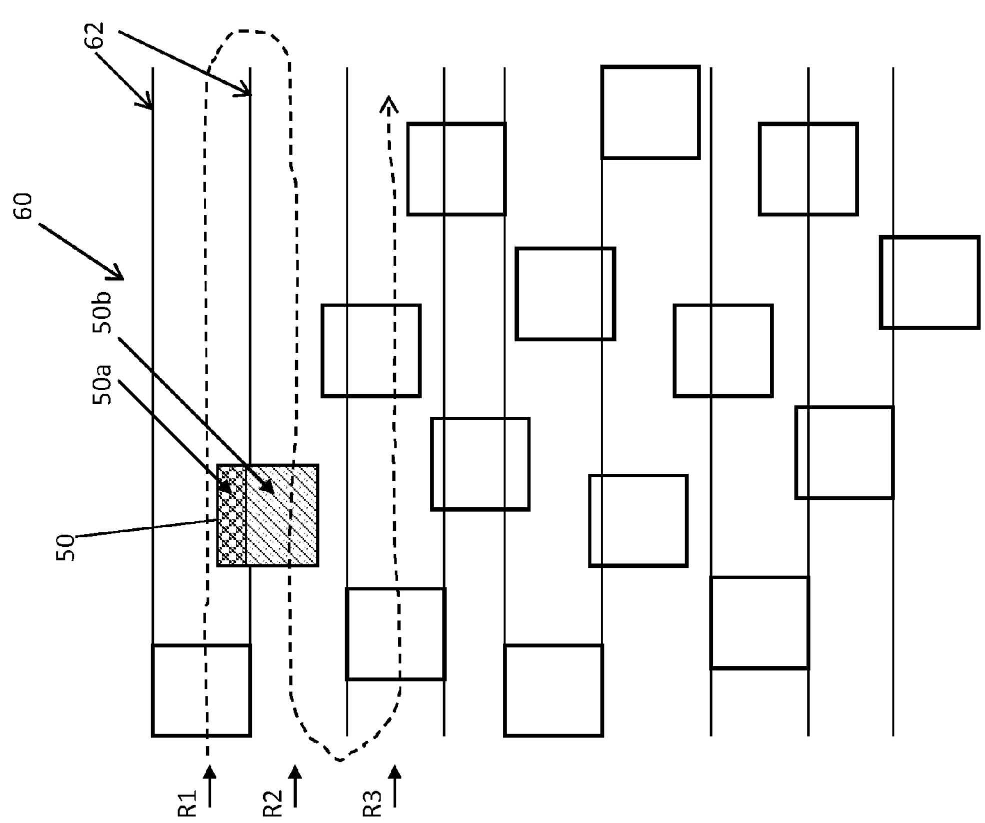
FIGS. 4 and 5 show a pattern of non-critical elements before and after optimization using a method of the invention, respectively.

Another embodiment of the invention includes an additional way to improve photomask fabrication time and yields, during photomask production, through the reduction in the number of exposure shots used for the given photomask pattern. Turning to FIG. 4, a pattern 60 for writing non-critical elements 50 is shown. FIG. 4 also shows grid lines 62 that represent the grid lines of an operational grid of the write tool. As one of ordinary skill in the art would understand, a write tool moves laterally back and forth over a wafer to print the photomask. Grid lines 62 therefore represent the path the write tool will travel as it prints the photomask, as illustrated by the dashed arrows in FIG. 4. For example, write tool will travel down row R1 in between grid lines 62, then down row R2, then down row R3, etc. As shown in FIG. 4, using pattern 60, at least one non-critical element 50 overlaps at least one grid line 62 of the operational grid of the write tool. For any non-critical element 50 that overlaps grid lines 62, more than one exposure shot will be needed by the write tool to print that non-critical element 50. In other words, if a non-critical element 50 overlaps a grid line 62, and therefore spans two rows, the write tool will print only a portion of non-critical element 50 in a first row between grid lines 62 on a first scan, and then on a second scan of the next row, will print the remaining portion of non-critical element 50. Using the example shown in FIG. 4, a non-critical element 50 is shown that overlaps grid line 62 such that a first portion 50*a* of non-critical element 50 is in row R1, and a second portion 50*b* of non-critical element 50 is in row R2. Therefore, as the write tool travels up and down the grid lines, it will use one shot to print first portion 50*a* of non-critical element 50 when it travels down row R1, and a second shot to print second portion 50*b* of non-critical element 50 when it travels down row R2.

Figure 5:
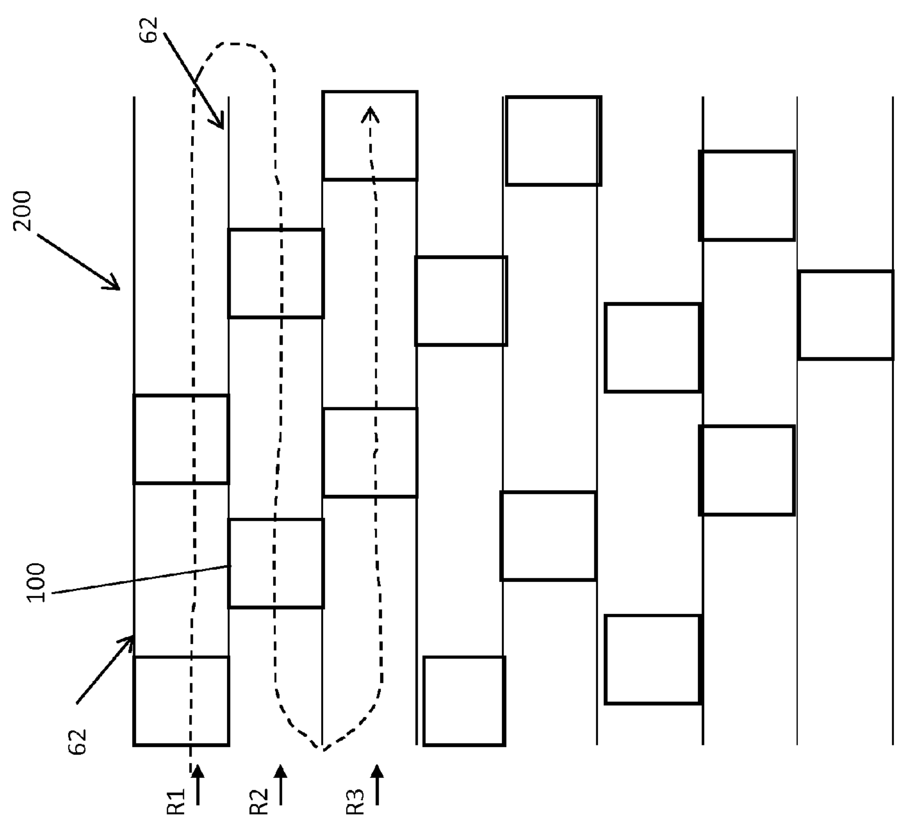

Turning to FIG. 5, an improved pattern 200 of non-critical elements 100 according to an embodiment of this invention is shown. Specifically, fracturing program 30 configures pattern 200 such that non-critical elements 100 are aligned with grid lines 62 of the operational grid of the write tool. This configured pattern 200 will improve photomask fabrication time and yields, during photomask production, through the reduction in the number of exposure shots used for photomask pattern 200 as compared to pattern 60. Because non-critical elements 100 in pattern 200 do not overlap grid lines 62 of the write tool grid, only one exposure shot by the write tool will be necessary to print non-critical elements 100. In other words, since each non-critical element 100 is substantially within grid lines 62, each non-critical element 100 is substantially within a single row, such that when the write tool travels down each row, it can print entire non-critical element 100 on a single pass. Using the example shown in FIGS. 4 and 5, the realignment of non-critical element 100 is illustrated by comparing non-critical element 50 in FIG. 4 where two shots are required to print both first portion 50*a* in row R1 and second portion 50*b* in row R2, with non-critical element 100 in FIG. 5 where only one shot is required because entire non-critical element 100 is in row R2. Therefore, aligning non-critical elements 100 to be coincident with a scan of the writing tool will reduce the number of shots necessary for printing each non-critical element 100, thereby improving photomask fabrication time. While the example shown in FIG. 5 of pattern 200 shows non-critical elements 100 substantially entirely within the rows of grid lines 62, it is understood that this may not practically be possible. Embodiments of this invention are directed to minimizing, if not entirely eliminating, overlap of non-critical elements over grid lines 62. As long as non-critical elements 100 shown in FIG. 5 have been re-aligned with respect to non-critical elements 50 shown in FIG. 4, pattern 200 will require less exposure shots than pattern 60, and therefore photomask fabrication time will be improved.

In another embodiment of the invention, fracturing program 30 improves shot count by modifying the manufacturing parameters and placement of non-critical elements 100. As one of ordinary skill in the art would understand, typically, when printing elements, critical or non-critical, on a photomask, a multi-pass exposure is utilized, i.e., a total dose is broken into smaller doses to avoid local heating and to average out potential size and placement errors. According to an embodiment of this invention, fracturing program 30 determines which elements to be printed on the photomask are critical and which elements are non-critical. Fracturing program 30 accomplishes this determination by looking at "marker layers" in the data, as known in the art, or by looking at specific geometric characteristics. These specific geometric characteristics can include the dimensions of the element, the layout of the element, or the interactions of the element with other masking layers. Once fracturing program 30 determines which elements are non-critical and which are critical, fracturing program 30 will indicate to the write tool (e.g., by modifying write tool data 40), that the non-critical elements are to be printed with one set of exposure parameters, which are optimized for speed rather than performance, while the critical elements are to be printed with a different set of exposure parameters, which are optimized for performance rather than speed. In one embodiment, this is accomplished by printing the non-critical elements using a single pass exposure, while printing the critical elements using a multi-pass exposure.

While a single pass exposure discussed herein generally refers to one shot, i.e., printing the full dose with a single shot, it is understood that less than a full dose can be used, and then the dosage can be chosen, in conjunction with shot size, to optimize the number of shots. In other words, fracturing program 30 can instruct the write tool to optimize the shot counts for the non-critical elements by indicating a single pass exposure is to be used for the non-critical elements, or by indicating that some other number of exposure shots is to be used for the non-critical elements, while a different, e.g., higher, number of exposure shots are used for the critical elements.

While shown and described herein is a method and system for reconfiguring non-critical element shapes and patterns, and/or modifying manufacturing parameters and placement of non-critical elements to reduce the number of exposure shots required for a given photomask pattern, it is understood that aspects of the invention further provide various alternative embodiments. For example, in one embodiment, the invention provides a computer program fixed in at least one computer-readable medium, which when executed, enables a computer system to reconfigure non-critical element shapes and patterns, and to modify the manufacturing parameters and placement of non-critical elements to reduce the number of exposure shots required for a given photomask pattern. To this extent, the computer-readable medium includes program code, such as fracturing program 30 (FIG. 1), which implements some or all of a process described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; and/or the like.

In another embodiment, the invention provides a method of providing a copy of program code, such as fracturing program 30 (FIG. 1), which implements some or all of a process described herein. In this case, a computer system can process a copy of program code that implements some or all of a process described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for configuring non-critical element shapes and patterns, and/or modifying the manufacturing parameters and placement of non-critical elements to reduce the number of exposure shots required for a given photomask pattern. In this case, a computer system, such as computer system 20 (FIG. 1), can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

It is understood that aspects of the invention can be implemented as part of a business method that performs a process described herein on a subscription, advertising, and/or fee basis. That is, a service provider could offer to configure non-critical element shapes and patterns, and/or modify the manufacturing parameters or placement of non-critical elements to reduce the number of exposure shots required for a given photomask pattern as described herein. In this case, the service provider can manage (e.g., create, maintain, support, etc.) a computer system, such as computer system 20 (FIG. 1), that performs a process described herein for one or more customers. In return, the service provider can receive payment from the customer(s) under a subscription and/or fee agreement, receive payment from the sale of advertising to one or more third parties, and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to a person skilled in the art are intended to be included within the scope of the invention as defined by the accompanying claims.

What is claimed is:

1. A method comprising:

identifying, using at least one computing device, which elements are non-critical in a predetermined set of design data used for printing a given photomask pattern, the design data including both non-critical elements and critical elements, at least one non-critical element having a shape requiring a predetermined number of multiple write tool shots; and reconfiguring, using the at least one computing device, the at least one non-critical element into a reconfigured shape that the write tool can write with a number of shots less than the predetermined number, wherein the reconfigured shape has an area equal to an area of the respective at least one non-critical element, to reduce the number of exposure shots required for the given photomask pattern, wherein the reconfiguring includes segmenting the non-critical elements into segments based on write tool limitations, optical proximity correction (OPC) limitations, and lithographic limitations, the write tool limitations including a shot size limit of approximately 1 μm.

2. The method of claim 1, wherein the OPC and lithographic limitations include feature resolution, proximity requirements, and general printability requirements.

3. The method of claim 1, wherein the non-critical elements comprise elements selected from the group consisting of: fill shapes, fiducials, barcodes, custom SPC, test and monitoring circuits, clear bars and probe pads.

4. The method of claim 1, further comprising printing the photomask after reconfiguring the at least one non-critical element.

5. The method of claim 1, wherein the design data includes a pattern for writing the non-critical elements, wherein the pattern results in at least one non-critical element overlapping at least one grid line of an operational grid of the write tool, the method further comprising reconfiguring the pattern of the non-critical elements into a reconfigured pattern such that the non-critical elements are aligned with the grid lines of the operational grid of the write tool.

6. A method comprising:

identifying, at least one computing device, which elements are non-critical in a predetermined set of design data used for printing a given photomask pattern by a write tool, the design data including both non-critical elements and critical elements, the design data further including a pattern for writing the non-critical elements, wherein the pattern results in at least one non-critical element overlapping at least one grid line of an operational grid of the write tool;

reconfiguring, the at least one computing device, the pattern into a reconfigured pattern such that the non-critical elements are aligned with the grid lines of the operational grid of the write tool to reduce the number of exposure shots required for the given photomask pattern.

7. The method of claim 6, wherein the write tool has a shot size limit of approximately 1 μm.

8. The method of claim 6, wherein the non-critical elements comprise elements selected from the group consisting of: fill shapes, fiducials, barcodes, custom SPC, test and monitoring circuits, clear bars and probe pads.

9. The method of claim 6, further comprising printing the photomask after reconfiguring the pattern such that the non-critical elements are aligned such that the non-critical elements are coincident with a scan of the writing tool.

10. The method of claim 6, wherein the at least one non-critical element has a shape requiring a predetermined number of multiple write tool shots, the method further comprising reconfiguring the at least one non-critical element into a reconfigured shape that the write tool can write with a number of shots less than the predetermined number, wherein the reconfigured shape has an area equal to an area of the respective at least one non-critical element.

11. A method comprising:

providing a predetermined set of design data including a set of elements to be used for printing a given photomask pattern, the design data including both non-critical elements and critical elements;

identifying which elements in the set of elements are critical elements and which elements in the set of elements are non-critical elements, wherein the design data further includes a pattern for printing the non-critical elements with a write tool, wherein the pattern results in at least one non-critical element overlapping at least one grid line of an operational grid of the write tool;

reconfiguring the pattern of the non-critical elements into a reconfigured pattern such that the non-critical elements are aligned with the grid lines of the operational grid of the write tool;

printing the critical elements using a first exposure parameter on the photomask; and printing the non-critical elements using a second exposure parameter on the photomask.

12. The method of claim 11, wherein the first exposure parameter comprises printing the critical elements with a multi-pass exposure, and wherein the second exposure parameter comprises printing the non-critical elements with a single-pass exposure.

13. The method of claim 11, wherein the identifying is based on at least one of the following: a marker layer of the photomask, a dimension of an element, a layout of an element and an interaction of an element with other masking layers in the photomask.

14. The method of claim 11, wherein at least one non-critical element has a shape requiring a predetermined number of multiple write tool shots, the method further comprising reconfiguring the at least one non-critical element into a reconfigured shape that a write tool can write with a number of shots less than the predetermined number, wherein the reconfigured shape has an area equal to an area of the respective at least one non-critical element.

15. A computer program comprising program code embodied in at least one computer-readable storage medium, which when executed, enables a computer system to implement a method of reducing the number of exposure shots required for a photomask pattern, the method comprising:

providing a predetermined set of design data including a set of elements to be used for printing a given photomask pattern, the design data including both non-critical elements and critical elements, at least one non-critical element having a shape requiring a predetermined number of multiple write tool shots;

identifying which elements in the set of elements are critical elements and which elements in the set of elements are non-critical elements, wherein the design data includes a pattern for writing the non-critical elements, wherein the pattern results in at least one non-critical element overlapping at least one grid line of an operational grid of the write tool; and reconfiguring the at least one non-critical element into a reconfigured shape that the write tool can write with a number of shots less than the predetermined number, wherein the reconfigured shape has an area equal to an area of the respective at least one non-critical element, to reduce the number of exposure shots required for the given photomask pattern, and reconfiguring the pattern of the non-critical elements into a reconfigured pattern such that the non-critical elements are aligned with the grid lines of the operational grid of the write tool.

16. The computer program of claim 15, the method further comprising:

printing the critical elements using a multi-pass exposure on the photomask; and printing the non-critical elements using a single-pass exposure on the photomask.

* * * * *